(12) United States Patent
Lee

(10) Patent No.: US 10,581,458 B2
(45) Date of Patent: Mar. 3, 2020

(54) DATA STORAGE APPARATUS AND OPERATING METHOD THEREOF

(71) Applicant: SK hynix Inc., Gyeonggi-do (KR)

(72) Inventor: Seon Ju Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 49 days.

(21) Appl. No.: 15/909,144

(22) Filed: Mar. 1, 2018

(65) Prior Publication Data

US 2019/0068222 A1 Feb. 28, 2019

(30) Foreign Application Priority Data

Aug. 25, 2017 (KR) .................. 10-2017-0107696

(51) Int. Cl.
| | | |
|---|---|---|
| *G06F 11/00* | (2006.01) | |
| *G08C 25/00* | (2006.01) | |
| *H04M 13/00* | (2006.01) | |
| *H04L 1/00* | (2006.01) | |
| *H03M 13/11* | (2006.01) | |
| *G06F 11/10* | (2006.01) | |
| *G06F 3/06* | (2006.01) | |
| *H03M 13/37* | (2006.01) | |
| *G11C 29/50* | (2006.01) | |
| *G11C 29/52* | (2006.01) | |
| *G11C 11/56* | (2006.01) | |
| *H03M 13/15* | (2006.01) | |
| *H03M 13/19* | (2006.01) | |

(Continued)

(52) U.S. Cl.
CPC ....... *H03M 13/1128* (2013.01); *G06F 3/0613* (2013.01); *G06F 11/1048* (2013.01); *H03M 13/1108* (2013.01); *H03M 13/1111* (2013.01); *H03M 13/3715* (2013.01); *G11C 11/5642* (2013.01); *G11C 29/42* (2013.01); *G11C 29/50004* (2013.01); *G11C 29/52* (2013.01); *H03M 13/1102* (2013.01); *H03M 13/136* (2013.01); *H03M 13/152* (2013.01); *H03M 13/1515* (2013.01); *H03M 13/19* (2013.01); *H03M 13/23* (2013.01); *H03M 13/2957* (2013.01)

(58) Field of Classification Search
CPC ......... H03M 13/1128; H03M 13/1108; H03M 13/1111; G06F 11/1048; G06F 3/0613; G11C 29/50004; G11C 29/52; G11C 29/42; G11C 11/5642
See application file for complete search history.

(56) References Cited

U.S. PATENT DOCUMENTS

| | | | |
|---|---|---|---|
| 8,315,092 B2 | 11/2012 | Strasser et al. | |
| 9,437,320 B1* | 9/2016 | Nguyen | ............... G11C 16/349 |
| 2013/0080691 A1* | 3/2013 | Weingarten | ......... G06F 12/0246 |
| | | | 711/103 |

FOREIGN PATENT DOCUMENTS

KR  1020110036816  4/2011

* cited by examiner

*Primary Examiner* — Samir W Rizk
(74) *Attorney, Agent, or Firm* — IP & T Group LLP

(57) ABSTRACT

A data storage apparatus includes a nonvolatile memory device and a controller configured to decode on normal read data read from a target memory cell, calculate a standard deviation of history read voltages for a target memory block including the target memory cell when the decoding of the normal read data fails, compare the calculated standard deviation with a preset first threshold value and a preset second threshold value, and determine a decoding type and a decoding order for the target memory cell based on a comparison result.

20 Claims, 8 Drawing Sheets

(51) Int. Cl.
*H03M 13/29* (2006.01)
*H03M 13/13* (2006.01)
*H03M 13/23* (2006.01)
*G11C 29/42* (2006.01)

HRT

| | | $\Delta RV_{t1}$ | $\Delta RV_{t2}$ | $\Delta RV_{t3}$ | $\Delta RV_{t4}$ | $\Delta RV_{t5}$ | $\Delta RV_{t6}$ | $\Delta RV_{t7}$ |
|---|---|---|---|---|---|---|---|---|
| B1 | 1 | 3 | 0 | 0 | 0 | 7 | 0 | 0 |
| | 2 | 5 | 0 | 0 | 0 | 10 | 0 | 0 |
| | 3 | 4 | 0 | 0 | 0 | 9 | 0 | 0 |
| | 4 | 0 | 0 | 0 | 0 | 0 | 0 | 0 |
| | 5 | 0 | 0 | 0 | 0 | 0 | 0 | 0 |
| ⋮ | ⋮ | ⋮ | ⋮ | ⋮ | ⋮ | ⋮ | ⋮ | ⋮ |
| Bm | 1 | 0 | 0 | 0 | 0 | 0 | 0 | 0 |
| | 2 | 0 | 0 | 0 | 0 | 0 | 0 | 0 |
| | 3 | 0 | 0 | 0 | 0 | 0 | 0 | 0 |
| | 4 | 0 | 0 | 0 | 0 | 0 | 0 | 0 |
| | 5 | 0 | 0 | 0 | 0 | 0 | 0 | 0 |

(HRVG spans $\Delta RV_{t1}$ through $\Delta RV_{t7}$)

DATA STORAGE APPARATUS AND OPERATING METHOD THEREOF

CROSS-REFERENCES TO RELATED APPLICATION

The present application claims priority under 35 U.S.C. § 119(a) to Korean patent application number 10-2017-0107696, filed on Aug. 25, 2017, which is incorporated herein by reference in its entirety.

BACKGROUND

1. Technical Field

Various embodiments may generally relate to a semiconductor apparatus, and more particularly, to a data storage apparatus and an operation method thereof.

2. Related Art

In recent years, the paradigm for computer environments has been changed into ubiquitous computing which may use computer systems every time everywhere. As a result, use of a portable electronic apparatus such as a mobile phone, a digital camera, and a laptop computer has been increasing rapidly. Generally, a portable electronic apparatus uses a data storage apparatus employing a memory device for storing data which are used by the portable electronic apparatus.

A data storage apparatus using a memory device has excellent stability and durability because it does not include a mechanical driving unit. Further, a data storage apparatus using the memory device is advantageous in that it may access data faster and consume less power. Non-limiting examples of a data storage apparatus having such advantages include a universal serial bus (USB) memory device, a memory card having various interfaces, a universal flash storage (UFS) device, a solid-state drive (SSD), and the like.

SUMMARY

Embodiments are directed to a data storage apparatus exhibiting improved read performance and an operation method thereof.

In an embodiment of the present disclosure, a data storage apparatus include: a nonvolatile memory device; and a controller is configured to decode on normal read data read from a target memory cell, calculate a standard deviation of history read voltages for a target memory block including the target memory cell when the decoding of the normal read data fails, compare the calculated standard deviation with a preset first threshold value and a preset second threshold value, and determine a decoding type and a decoding order for the target memory cell based on a comparison result.

In an embodiment of the present disclosure, an operation method of a data storage apparatus include: determining whether or not decoding of normal read data read from a target memory cell fails; calculating a standard deviation of history read voltages for a target memory block including the target memory cell when the decoding of the normal read data fails; comparing the standard deviation with a preset first threshold value and a preset second threshold value; and determining a decoding type and a decoding order for the target memory cell based on a comparison result.

In an embodiment of the present disclosure, a data processing apparatus include: a host apparatus; and a data storage apparatus operably coupled to the host apparatus and comprising: a nonvolatile memory device; and a controller configured to decode on normal read data read from a target memory cell, calculate a standard deviation of history read voltages for a target memory block including the target memory cell when the decoding of the normal read data fails, compare the calculated standard deviation with a preset first threshold value and a preset second threshold value, and determine a decoding type and a decoding order for the target memory cell based on a comparison result.

These and other features, aspects, and embodiments are described below in the section entitled "DETAILED DESCRIPTION."

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
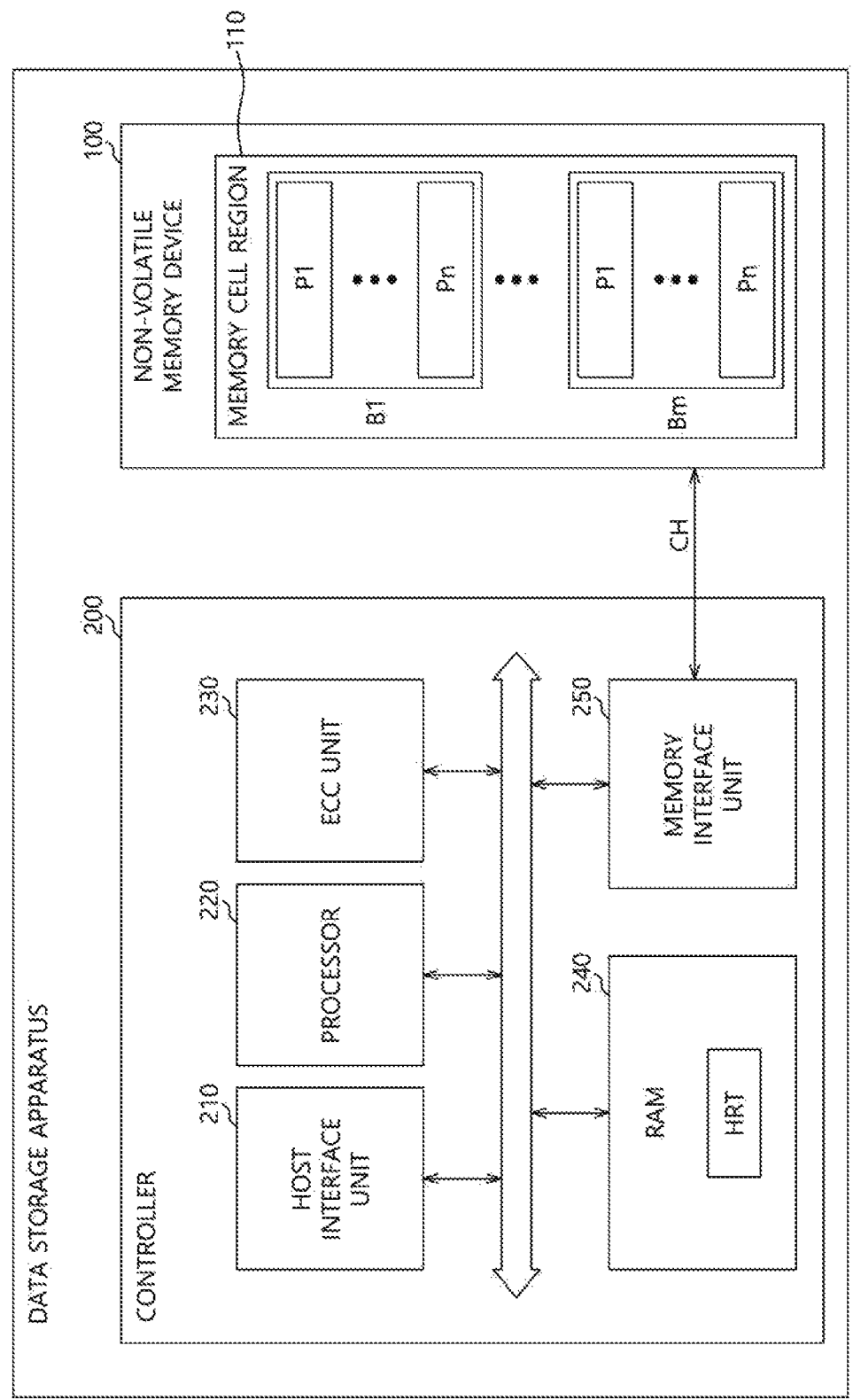
FIG. 1 is a block diagram illustrating a data storage apparatus according to an embodiment of the present disclosure.
Figures 2, 3:
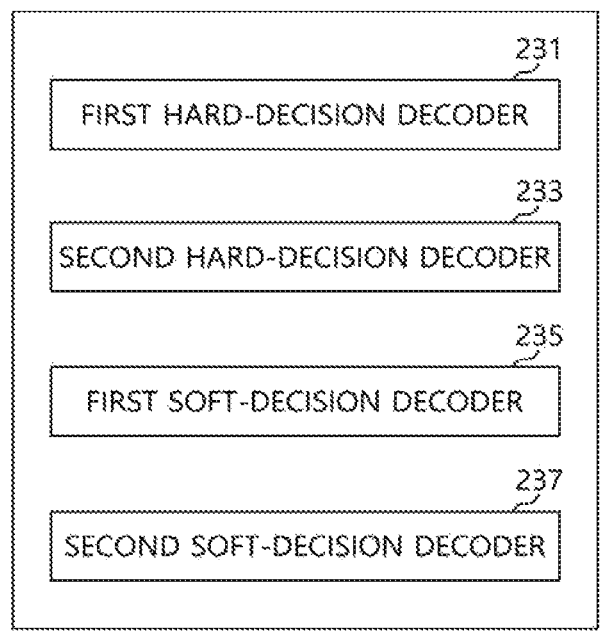
FIG. 2 is a block diagram illustrating an ECC unit shown in FIG. 1.
FIG. 3 is a diagram illustrating a history read table shown in FIG. 1.

FIG. 1 is a block diagram illustrating a data storage apparatus 10 according to an embodiment of the present disclosure. FIG. 2 is a diagram illustrating an error correction code (ECC) unit 230 of FIG. 1. FIG. 3 is a diagram illustrating a history read table HRT of FIG. 1

Referring to FIG. 1, the data storage apparatus 10 may store data to be accessed by a host apparatus (not shown) such as a mobile phone, an MP3 player, a laptop computer, a desktop computer, a game player, a television (TV), or an in-vehicle infotainment system, and the like. The data storage apparatus 10 may also be referred to as a memory system.

The data storage apparatus 10 may be manufactured as any one among various types of storage apparatuses and may be operatively coupled to a host apparatus via a suitable interface capable of communicating with the host according to a communication protocol of the host apparatus. For example, the data storage apparatus 10 may be configured in various forms, such as a solid state drive (SSD), a multimedia card in the form of an MMC, an eMMC, an RS-MMC, and a micro-MMC, a secure digital card in the form of an SD, a mini-SD, and a micro-SD, a universal serial bus (USB) storage device, a universal flash storage (UFS) device, a personal computer memory card international association (PCMCIA) card type storage device, a peripheral component interconnection (PCI) card type storage device, a PCI-express (PCI-E) card type storage device, a compact flash (CF) card, a smart media card, a memory stick, and the like.

The data storage apparatus 10 may be manufactured as any one among various types of packages. For example, the data storage apparatus 10 may be manufactured as any one of various types of packages, such as a package on package (POP), a system in package (SIP), a system on chip (SOC), a multi-chip package (MCP), a chip on board (COB), a wafer-level fabricated package (WFP), and a wafer-level stack package (WSP).

The data storage apparatus 10 may include a nonvolatile memory device 100 and a controller 200.

The nonvolatile memory device 100 may be operated as a storage medium of the data storage apparatus 10. The nonvolatile memory device 100 may include any one of various types of nonvolatile memory devices, such as a NAND flash memory device, a NOR flash memory device, a ferroelectric random-access memory (FRAM) using a ferroelectric capacitor, a magnetic random-access memory (MRAM) using a tunneling magneto-resistive (TMR) layer, a phase-change random-access memory (PRAM) using a chalcogenide alloy, and a resistive random-access memory (RERAM) using a transition metal compound.

It has been illustrated in FIG. 1 that the data storage apparatus 10 includes one nonvolatile memory device 100 for clarity, but the data storage apparatus 10 may include a plurality of nonvolatile memory devices. The data storage apparatus 10 may be equally implemented with having a plurality of nonvolatile memory devices.

The nonvolatile memory device 100 may include a memory cell array 110 including a plurality of memory cells arranged in regions in which a plurality of bit lines (not shown) and a plurality of word lines (not shown) cross each other. In an embodiment, the memory cell array 110 may include a plurality of memory blocks B1 to Bm and each of the plurality of memory blocks B1 to Bm may include a plurality of pages P1 to Pn.

Each of the memory cells in the memory cell array 110 may be at least one among a single level cell (SLC) in which a single bit data (for example, 1-bit data) is stored, a multilevel cell (MLC) in which 2-bit data is stored, a triple level cell (TLC) in which 3-bit data is stored, and a quad level cell QLC in which 4-bit data is stored. The memory cells in the memory cell array 110 may be of the SLC and/or MLC type. The memory cell array 110 may have a two-dimensional (2D) horizontal structure or a 3D structure. A 3D structure may be generally preferred because it allows higher memory cell density.

The controller 200 may control an overall operation of the data storage apparatus 10 through driving of firmware and/or software loaded onto a random-access memory (RAM) 240. The controller 200 may decode and drive a code-type instruction or algorithm such as the firmware or software. The controller 200 may be implemented in hardware or a combination of hardware and software.

The controller 200 may include a host interface unit 210, a processor 220, the ECC unit 230, the RAM 240, and a memory interface unit 250.

The host interface unit 210 may perform interfacing between the host apparatus and the data storage apparatus 10 according to a protocol of the host apparatus. For example, the host interface unit 210 may communicate with the host apparatus through any one among a USB protocol, a UFS protocol, an MMC protocol, a parallel advanced technology attachment (DATA) protocol, a serial advanced technology attachment (SATA) protocol, a small computer system interface (SCSI) protocol, a serial attached SCSI (SAS) protocol, a PCI protocol, and a PCI express (PCI-E) protocol. The host interface unit 210 may also provide power supply connection between the host apparatus and the data storage apparatus 10.

The processor 220 may be configured as a micro control unit (MCU) or a central processing unit (CPU). The processor 220 may process a request transmitted from the host apparatus. To process the request transmitted from the host apparatus, the processor 220 may drive a code-type instruction or algorithm loaded onto the RAM 240, for example, firmware and control internal function blocks, such as the host interface unit 210, the ECC unit 230, the RAM 240, the memory interface unit 250, and the like and the nonvolatile memory device 100.

The processor 220 may generate control signals for controlling an operation of the nonvolatile memory device 100 based on requests transmitted from the host apparatus and provide the generated control signals to the memory interface unit 250.

The ECC unit 230 may be configured to correct an error included in data read from the nonvolatile memory device 100 ("read data"). The ECC unit 230 may correct the error by decoding the read data according to an error correction code. The error correction code may include various types of error correction codes, for example, a Bose, Chaudhri, Hocquenghem (BCH) code, a Reed-Solomon (RS) code, a Reed-Muller (RM) code, a Hamming code, a convolution code, a low-density parity check (LDPC) code.

Referring to FIG. 2, the ECC unit 230 may include a first hard-decision decoder 231, a second hard-decision decoder 233, a first soft-decision decoder 235, and a second soft-decision decoder 237. It is noted that FIG. 2 illustrates that the ECC unit 230 includes only decoders, however, it should be apparent to those skilled in the art that the ECC unit 230 also includes at least one encoder configured to perform an ECC encoding operation.

The first hard-decision decoder 231 may be configured to perform first hard-decision decoding for correcting an error included in first read data read from the nonvolatile memory device 100 through a first read operation based on a history read voltage, according to a hard-decision algorithm. For example, a BCH code, an RS code, an RM code, a Hamming code, and the like may be used for the hard-decision decoding.

The history read voltage may refer to a read voltage used when the read data that the latest decoding operation is successful is read from a target memory block including a target memory region to be read. History read voltages for each of the memory blocks B1 to Bm included in the nonvolatile memory device 100 may be stored in a history read table HRT provided in the RAM 240 in a table form. The history read voltage may be stored as an offset value to a preset initial read voltage in the history read table HRT, but this is not limited thereto. The history read table HRT in the embodiment will be described later in detail with reference to FIG. 3.

The second hard-decision decoder 233 may be configured to perform second hard-decision decoding for correcting an error included in second read data read from the nonvolatile memory device 100 through a second read operation based on a read retry voltage and an optimal read voltage, according to the hard-decision algorithm.

The read retry voltage may refer to a read voltage having a certain voltage difference from the preset initial read voltage. A plurality of read retry voltages may be stored in a read retry voltage table provided in the RAM 240 in a table form. For example, the read retry table may be configured to include a plurality of read voltages having certain voltage differences from the initial read voltage. In another example, the read retry table may be configured to include the offset value to the initial read voltage, the number of read times, and the like.

The optimal read voltage may refer to a read voltage corresponding to a valley portion in which threshold voltage distributions overlap each other. The optimal read voltage may be obtained by calculating slopes of the threshold voltage distributions based on the preset initial read voltage and estimating the valley portion in which the threshold voltage distributions overlap each other based on the calculated slopes.

The first soft-decision decoder 235 may be configured to perform first soft-decision decoding for correcting an error included in pieces of third read data read from the nonvolatile memory device 100 through a plurality of read operations based on a plurality of read voltages (hereinafter, referring to as "first soft-decision read voltages") having fine voltage differences from a first final read voltage, according to a soft-decision algorithm. For example, a convolution code, an LDPC code, and the like may be used for the soft-decision decoding. The hard-decision decoding and the soft-decision decoding are known technology in the related art and thus detailed description thereof will be omitted. The first final read voltage used in the first soft-decision decoder 235 may refer to the final read voltage used in the first hard-decision decoder 231. For example, the first soft-decision decoder 235 may read the third read data using the plurality of first soft-decision read voltages having the fine voltage differences from the history read voltage latest stored in the history read table HRT, and detect and correct the error included in the third read data.

The second soft-decision decoder 237 may be configured to perform second soft-decision decoding for correcting an error included in pieces of fourth read data read from the nonvolatile memory device 100 through a plurality of read operations based on a plurality of read voltages (hereinafter, referring to as "second soft-decision read voltages") having fine voltage differences from a second final read voltage, according to the soft-decision algorithm.

The second final read voltage used in the second soft-decision decoder 237 may refer to the final read voltage used in the second hard-decision decoder 233. For example, the second soft-decision decoder 237 may read the fourth read data using the plurality of second soft-decision read voltages having the fine voltage differences from the latest used read voltage of the read retry voltage and the optimal read voltage which are used in the second hard-decision decoder 233, and detect and correct the error included in the fourth read data.

Referring back to FIG. 1, the RAM 240 may include a random-access memory such as a dynamic RAM (DRAM) or a static RAM (SRAM). The RAM 240 may store firmware driven through the processor 220. The RAM 240 may store data required for the driving of the firmware, for example, meta data. For example, the RAM 240 may be operated as a working memory of the processor 220.

The RAM 240 may be configured to temporarily store program data to be transmitted to the nonvolatile memory device 100 from the host apparatus, and read data to be transmitted to the host apparatus from the nonvolatile memory device 100. For example, the RAM 240 may be operated as a buffer memory.

The history read table HRT may be stored in the RAM 240. For example, the history read table HRT may be generated in an initial state, e.g., a state in which default value is stored in each entry of the history read table HRT in the RAM 240 whenever the power of the data storage apparatus 10 turns on. As an example '0 (zero)' is used as the default value in the embodiment illustrated in FIG. 3, but the default value is not limited thereto.

Referring to FIG. 3, the history read voltage for a TLC in which 3-bit data is stored has been illustrated. However, the history read voltages for SLC and other type MLC cells may also be stored in the history read table HRT.

The history read table HRT may include a plurality of history read voltage groups HRVG for each of the plurality of memory blocks B1 to Bm included in the nonvolatile memory device 100. As described above, when memory cells of the memory blocks B1 to Bm are a TLC, each of the history read voltage groups HRVG may include seven history read voltages $\Delta RV_{t1}$ to $\Delta RV_{t7}$.

It has been illustrated in FIG. 3 that five read voltage groups (HRVG) are included in each of the memory blocks B1 to Bm, but the number of history read voltage groups HRVG is not limited thereto. The history read voltages $\Delta RV_{t1}$ to $\Delta RV_{t7}$ included in the history read voltage group HRVG may be offset values to the initial read voltages.

Referring back to FIG. 1, when a read request is received from the host apparatus, the processor 220 may generate a normal read command for reading data from a read-requested target memory region and provide the normal read command to the nonvolatile memory device 100. For example, the normal read command may refer to a read command for performing a read operation based on a preset initial read voltage.

The nonvolatile memory device 100 may read data by performing a normal read operation on the target memory region in response to the normal read command provided from the processor 220, and transmit the normal read data to the processor 220. The processor 220 may control the ECC unit 230 to correct an error included in the normal read data by decoding the received normal read data. When the decoding of the normal read data is successful, the processor 220 may transmit the error corrected normal read data to the host apparatus. When the decoding of the normal read data fails, the processor 220 may determine whether or not the history read voltage for the target memory block including the target memory region is present with reference to the history read table HRT stored in the RAM 240.

When the history read voltage for the target memory block is absent, the processor 220 may control the ECC unit 230 to sequentially perform the second hard-decision decoding and the second soft-decision decoding for the target memory region. For example, the performing of the second soft-decision decoding may be determined according to whether or not the second hard-decision decoding is successful. In this example, when the second hard-decision decoding is successful, the second soft-decision decoding may not be performed.

When the history read voltage for the target memory block is present, the processor 220 may determine whether or not the number of history read voltages is equal to or larger than n, wherein n is a natural number of 2 or more. For example, when the number of history read voltages is less than 2, the processor 220 may control the ECC unit 230 to sequentially perform the first hard-decision decoding, the second hard-decision decoding, and the second soft-decision decoding for the target memory region. In this example, the performing of the second hard-decision decoding may be determined according to whether or not the first hard-decision decoding is successful, and the performing of the second soft-decision decoding may be determined according to whether or not the second hard-decision decoding is successful.

When the number of history read voltages is equal to or larger than n, the processor 220 may calculate a standard deviation of the history read voltages. For example, it may be assumed that the target memory region is a region included in the first memory block B1 and three first history read voltages $\Delta RV_{t1}$ and three fifth history read voltages $\Delta RV_{t5}$ of the first memory block B1 are stored in the history read table HRT. In this example, the processor 220 may calculate the standard deviation for the three first history read voltages $\Delta RV_{t1}$ stored in the history read table HRT and the standard deviation for the three fifth history read voltages $\Delta RV_{t5}$ stored in the history read table HRT.

The processor 220 may compare the calculated standard deviation with a preset first threshold value and a preset second threshold value. For example, the second threshold value may be larger than the first threshold value. In this example, the first threshold value may be a value corresponding to a maximum value that a corresponding memory block may be determined as a good memory block and the second threshold value may be a value corresponding to a minimum value that the corresponding memory block may be determined as a bad memory block.

The processor 220 may determine whether or not the standard deviation is larger than the first threshold value and is smaller than the second threshold value. When the standard deviation is larger than the first threshold value and smaller than the second threshold value, the processor 220 may determine that the target memory block is not bad memory block or good memory block. The processor 220 may control the operation of the nonvolatile memory device 100 and the operation of the ECC unit 230 to sequentially perform the first hard-decision decoding and the first soft-decision decoding on the target memory region. For example, the read voltage used for the first hard-decision decoding and the first soft-decision decoding may be the history read voltage latest stored in the history read table HRT. The performing of the first soft-decision decoding may be determined according to whether or not the first hard-decision decoding is successful.

The processor 220 may determine whether or not the first soft-decision decoding is successful and terminate the corresponding read operation when the first soft-decision decoding is successful. When the first soft-decision decoding fails, the processor 220 may control the operation of the nonvolatile memory device 100 and the operation of the ECC unit 230 to sequentially perform the second hard-decision decoding and the second soft-decision decoding on the target memory region. The performing of the second soft-decision decoding may be determined according to whether or not the second hard-decision decoding is successful.

When the standard deviation is not present between the first threshold value and the second threshold value, the processor 220 may determine whether or not the standard deviation is equal to or smaller than the first threshold value. When the standard deviation is not equal to or smaller than the first threshold value, the processor 220 may determine that the standard deviation is equal to or larger than the second threshold value and may determine the target memory block as a bad memory block. The processor 220 may control the operation of the nonvolatile memory device 100 and the operation of the ECC unit 230 to skip the first hard-decision decoding and directly perform the first soft-decision decoding operation on the target memory region. For example, the processor 220 may control the operation of the nonvolatile memory device 100 and the operation of the ECC unit 230 to sequentially perform the second hard-decision decoding and the second soft-decision decoding according to whether or not the first soft-decision decoding is successful.

When the standard deviation is equal to or smaller than the first threshold value, the processor 220 may determine the target memory block as a good memory block. The processor 220 may control the operation of the nonvolatile memory device 100 and the operation of the ECC unit 230 to sequentially perform the first hard-decision decoding and the second hard-decision decoding on the target memory region. For example, the performing of the second hard-decision decoding may be determined according to whether or not the first hard-decision decoding is successful.

When the standard deviation is larger than the first threshold value and smaller than the second threshold value, the processor 220 may determine that the target memory block is not bad memory block or good memory block, and the processor 220 may skip the second hard-decision decoding and perform the first soft-decision decoding after the first hard-decision decoding is performed. When the standard deviation is equal to or smaller than the first threshold value, the processor 220 may determine that the target memory block is a good memory block, and the processor 220 may skip the first soft-decision decoding and perform the second hard-decision decoding after the first hard-decision decoding is performed. When the standard deviation is equal to or larger than the second threshold value, the processor 220 may determine the target memory block as a bad memory block, and the processor 220 may skip the first hard-decision decoding and directly perform the first soft-decision decoding. For example, when the first soft-decision decoding fails, the processor 220 may sequentially perform the second hard-decision decoding and the second soft-decision decoding.

As described above, the data storage apparatus 10 may determine whether a state of the corresponding memory block is bad or good memory block based on the standard deviation of the history read voltages and select and set a decoding type and a decoding order according to a determination result. Accordingly, the degradation of the memory cell may be prevented through reduction in the number of unnecessary read times and read performance may be improved through reduction in the number of read times.

The memory interface unit 250 may control the nonvolatile memory device 100 according to control of the processor 220. The memory interface unit 250 may be referred to as a memory control unit. The memory interface unit 250 may provide control signals to the nonvolatile memory device 100. The control signals may include a command, an address, a control signal, and the like for controlling the nonvolatile memory device 100. The memory interface unit 250 as the memory control unit may provide data to the nonvolatile memory device 100 or receive data from the nonvolatile memory device 100.

Hereinafter, an operation method of a data storage apparatus according to the embodiment will be described with reference to FIG. 4 together with the configurations of FIGS. 1 to 3.

Figure 4:
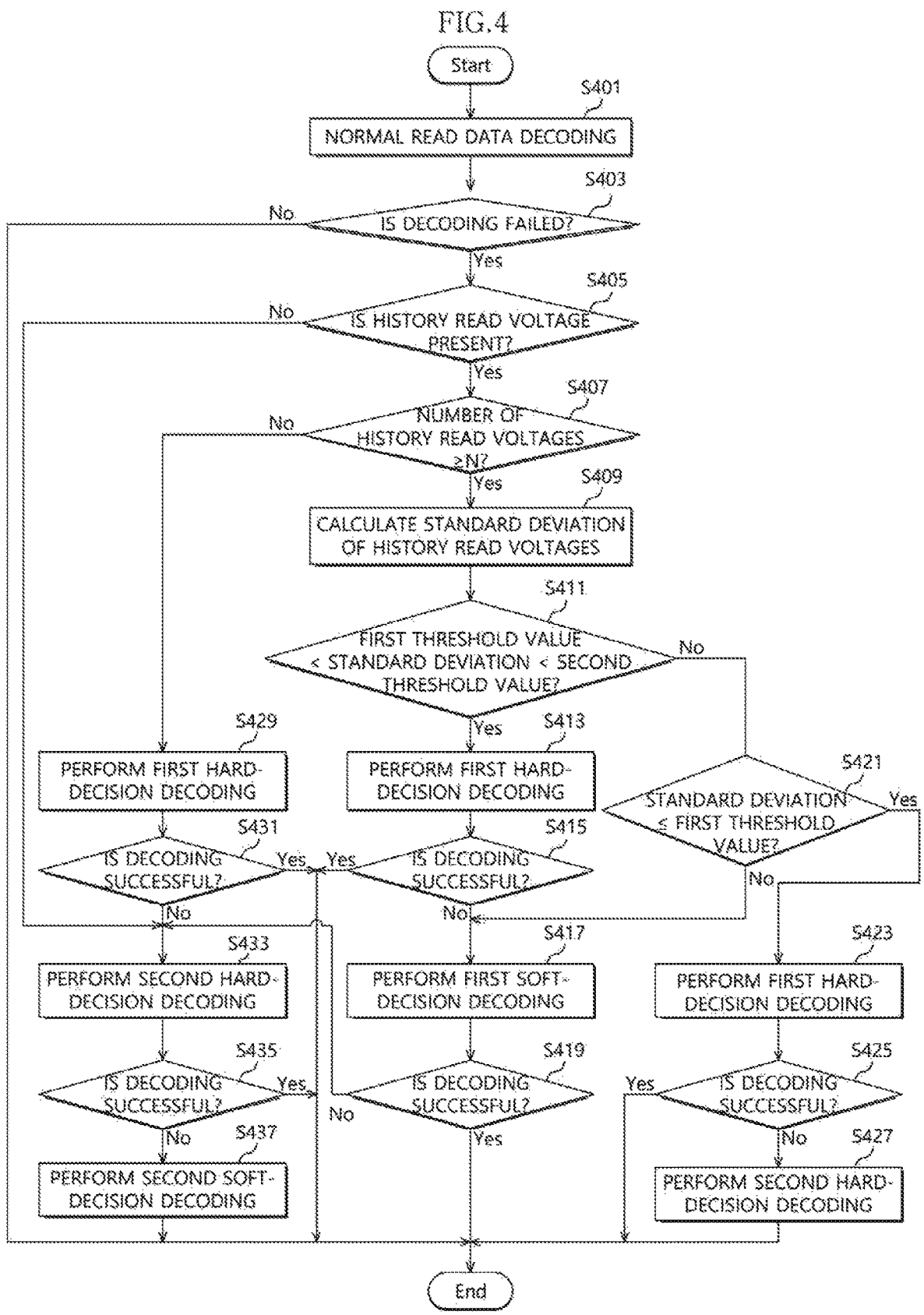
FIG. 4 is a flowchart illustrating an operation method of a data storage apparatus according to an embodiment of the present disclosure.

FIG. 4 is a flowchart illustrating an operation method of a data storage apparatus according to an embodiment of the present disclosure.

In operation S401, the processor 220 of the controller 200 may control the ECC unit 230 to correct an error included in normal read data by decoding the received normal read data read from a target memory region read-requested from the host apparatus. Here, the normal read data may refer to data read from the target memory region by the preset initial read voltage. The ECC unit 230 may provide a decoding result of the normal read data to the processor 220.

In operation S403, the processor 220 may determine whether or not the decoding of the normal read data fails based on the decoding result provided from the ECC unit 230. When the decoding of the normal read data is successful ("No" of operation S403), the processor 220 may transmit the error corrected normal read data to the host apparatus and terminate the read operation for the target memory region. When the decoding of the normal read data fails ("Yes" of operation S403), the processor 220 may proceed to operation S405.

In operation S405, the processor 220 may determine whether or not the history read voltage for the target memory block corresponding to the target memory region is present with reference to the history read table HRT stored in the RAM 240. When the history read voltage for the target memory block is not present ("No" of operation S405), the processor 220 may proceed to operation S433. When the history read voltage for the target memory block is present ("Yes" of operation S405), the processor 220 may proceed to operation S407.

In operation S407, the processor 220 may determine whether or not the number of history read voltages for the target memory block is equal to or larger than n. Here, n is a natural number which is equal to or larger than 2, but this is not limited thereto. When the number of history read voltages for the target memory block is equal to or larger than n ("Yes" of operation S407), the processor 220 may proceed to operation S409.

In operation S409, the processor 220 may calculate a standard deviation of the history read voltages for the target memory block.

In operation S411, the processor 220 may compare the standard deviation calculated in operation S409 with a preset first threshold value and a preset second threshold value and determine whether or not the standard deviation is larger than the first threshold value and is smaller than the second threshold value. When the standard deviation is larger than the first threshold value and smaller than the second threshold value ("Yes" of operation S411), the processor 220 may determine that the target memory block is not bad memory block or good memory block. The processor 220 may proceed to operation S413.

In operation S413, the processor 220 may control the nonvolatile memory device 100 and the ECC unit 230 to perform first hard-decision decoding on the target memory region. For example, the processor 220 may generate a first read command for performing a first read operation based on the latest stored history read voltage for the target memory block with reference to the history read table HRT and provide the generated first read command to the nonvolatile memory device 100. The nonvolatile memory device 100 may transmit first read data, which are read from the target memory region in response to the first read command provided from the processor 220, to the controller 200. The processor 220 may control the ECC unit 230 to perform the first hard-decision decoding on the received first read data. The ECC unit 230 may provide a first hard-decision decoding result for the first read data to the processor 220.

In operation S415, the processor 220 may determine whether or not the decoding of the first read data is successful based on the first hard-decision decoding result provided from the ECC unit 230. When the decoding of the first read data is successful ("Yes" of operation S415), the processor 220 may transmit the error corrected first read data to the host apparatus and terminate the read operation for the target memory region. When the decoding of the first read data fails ("No" of operation S415), the processor 220 may proceed to operation S417.

In operation S417, the processor 220 may control the nonvolatile memory device 100 and the ECC unit 230 to perform the first soft-decision decoding on the target memory region. For example, the processor 220 may generate a third read command for performing third read operations based on a plurality of first soft-decision read voltages having fine voltage differences from the latest stored history read voltage for the target memory block and provide the generated third read command to the nonvolatile memory device 100. The nonvolatile memory device 100 may transmit third read data, which are read from the target memory region in response to the third read command provided from the processor 220, to the controller 200. The processor 220 may control the ECC unit 230 to perform the first soft-decision decoding on the received third read data.

In operation S419, the processor 220 may determine whether or not the decoding of the third read data is successful based on the first soft-decision decoding result provided from the ECC unit 230. When the decoding of the third read data is successful ("Yes" of operation S419), the processor 220 may transmit the error corrected third read data to the host apparatus and terminate the read operation for the target memory region. When the decoding of the third read data fails ("No" of operation S419), the processor 220 may proceed to operation S433. Operations S433, S435, and S437 will be described later.

When the standard deviation is not present between the first threshold value and the second threshold value as a determination result of operation S411 ("No" of operation S411), the processor 220 may proceed to operation S421.

In operation S421, the processor 220 may determine whether or not the standard deviation is equal to or smaller than the first threshold value. When the standard deviation is larger than the first threshold value ("No" of operation S421), the processor 220 may determine that the target memory block is a bad memory block, and proceed to operation S417. When the standard deviation is equal to or smaller than the first threshold value ("Yes" of operation S421), the processor 220 may determine that the target memory block is a good memory block, and may proceed to operation S423.

In operation S423, the processor 220 may control the nonvolatile memory device 100 and the ECC unit 230 to perform the first hard-decision decoding on the target memory region.

In operation S425, the processor 220 may determine whether or not the decoding of the first read data is successful based on the first hard-decision decoding result provided from the ECC unit 230. When the decoding of the first read data is successful ("Yes" of operation S425), the processor 220 may transmit the error corrected first read data to the host apparatus and terminate the read operation for the target memory region. When the decoding of the first read data fails ("No" of operation S425), the processor 100 may proceed to operation S427.

In operation S427, the processor 220 may control the nonvolatile memory device 100 and the ECC unit 230 to perform second hard-decision decoding on the target memory region. For example, the processor 220 may generate a second read command for performing a second read operation based on a read retry voltage stored in the read retry table and an optimal read voltage, and provide the generated second read command to the nonvolatile memory device 100. The nonvolatile memory device 100 may transmit the second read data, which are read from the target memory region in response to the second read command provided from the processor 220, to the controller 200. The processor 220 may control the ECC unit 230 to perform the second hard-decision decoding on the received second read data.

In operation S407, when the number of history read voltages for the target memory block is less than n ("No" of operation S407), the processor 220 may proceed to operation S429.

In operation S429, the processor 220 may control the nonvolatile memory device 100 and the ECC unit 230 to perform the first hard-decision decoding on the target memory region.

In operation S431, the processor 220 may determine whether or not the decoding of the first read data is successful based on the first hard-decision decoding result provided from the ECC unit 230. When the decoding of the first read data is successful ("Yes" of operation S431), the processor 220 may transmit the error corrected first read data to the host apparatus and terminate the read operation for the target memory region. When the decoding of the first read data fails ("No" of operation S431), the processor 220 may proceed to operation S433.

In operation S433, the processor 220 may control the nonvolatile memory device 100 and the ECC unit 230 to perform the second hard-decision decoding on the target memory region.

In operation S435, the processor 220 may determine whether or the decoding of the second read data is successful based on the second hard-decision decoding result provided from the ECC unit 230. When the decoding of the second read data is successful ("Yes" of operation S435), the processor 220 may transmit the error corrected second read data to the host apparatus and terminate the read operation for the target memory region. When the decoding of the second read data fails ("No" of operation S435), the processor 220 may proceed to operation S437.

In operation S437, the processor 220 may control the nonvolatile memory device 100 and the ECC unit 230 to perform second soft-decision decoding on the target memory region. For example, the processor 220 may generate a fourth read command for performing fourth read operations based on a plurality of second soft-decision read voltages having fine voltage differences from the latest used read voltage among the read retry voltage stored in the read retry table and the optimal read voltage, and provide the generated fourth read command to the nonvolatile memory device 100. The nonvolatile memory device 100 may transmit fourth read data, which are read from the target memory region in response to the fourth read command provided from the processor 220, to the controller 200. The processor 220 may control the ECC unit 230 to perform the second soft-decision decoding on the received fourth read data.

Figure 5:
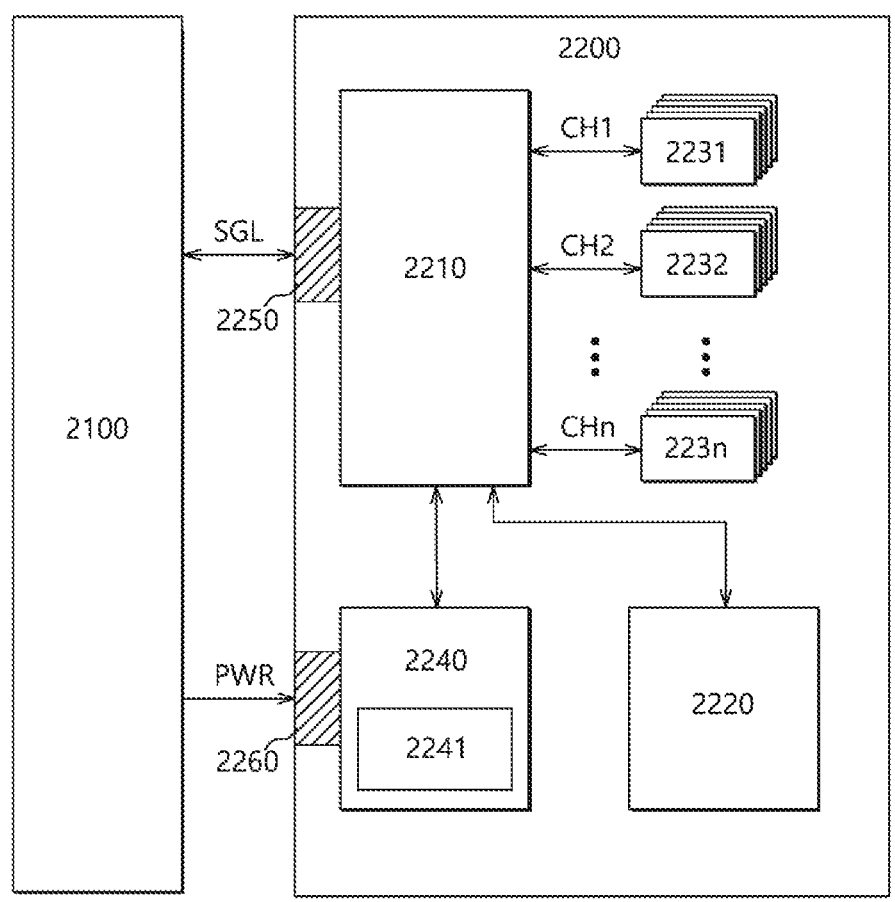
FIG. 5 is a diagram illustrating a data processing system including a solid-state drive (SSD) according to an embodiment of the present disclosure.

FIG. 5 is a diagram illustrating a data processing system 2000 including a solid-state drive (SSD) 2200 according to an embodiment of the present disclosure. Referring to FIG. 5, the data processing system 2000 may include a host apparatus 2100 and the SSD 2200.

The SSD 2200 may include a controller 2210, a buffer memory device 2220, a plurality of nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn, respectively. One or more nonvolatile memory devices may be coupled to one channel. The nonvolatile memory devices coupled to each channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR. The power connector 2260 may be configured by various types of connectors depending on a power supply scheme of the host apparatus 2100.

The controller 2210 may exchange a signal SGL with the host apparatus 2100 through the signal connector 2250. The signal SGL may include a command, an address, data, and the like. The signal connector 2250 may be configured of various types of connectors according to an interfacing method between the host apparatus 2100 and the SSD 2200.

Figure 6:
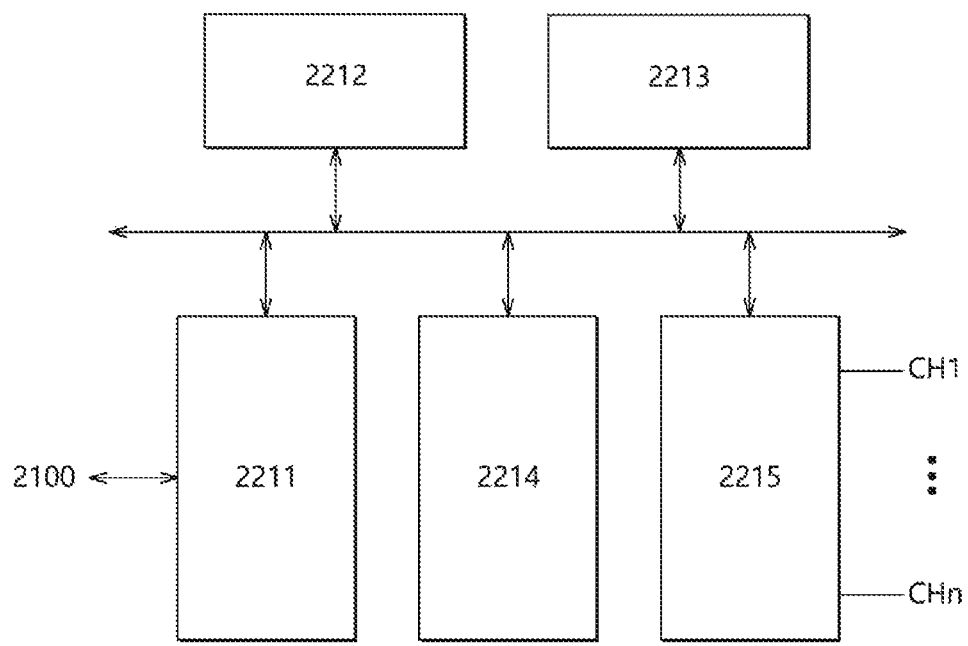
FIG. 6 is a diagram illustrating a controller illustrated in FIG. 5.

FIG. 6 is a diagram illustrating the controller 2210 of FIG. 5. Referring to FIG. 6, the controller 2210 may include a host interface unit 2211, a control unit 2212, a random-access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-E) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL input from the host apparatus 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to the nonvolatile memory devices 2231 to 223*n*. The generated parity data may be stored in the nonvolatile memory devices 2231 to 223*n* together with the data. The ECC unit 2214 may detect errors for data read from the nonvolatile memory devices 2231 to 223*n* based on the parity data. When detected errors are within a correctable range, the ECC unit 2214 may correct the detected errors.

The memory interface unit 2215 may provide a control signal such as a command and an address to the nonvolatile memory devices 2231 to 223*n* according to control of the control unit 2212. The memory interface unit 2215 may exchange data with the nonvolatile memory devices 2231 to 223*n* according to control of the control unit 2212. For example, the memory interface unit 2215 may provide data stored in the buffer memory device 2220 to the nonvolatile memory devices 2231 to 223*n* or provide data read from the nonvolatile memory devices 2231 to 223*n* to the buffer memory device 2220.

Figure 7:
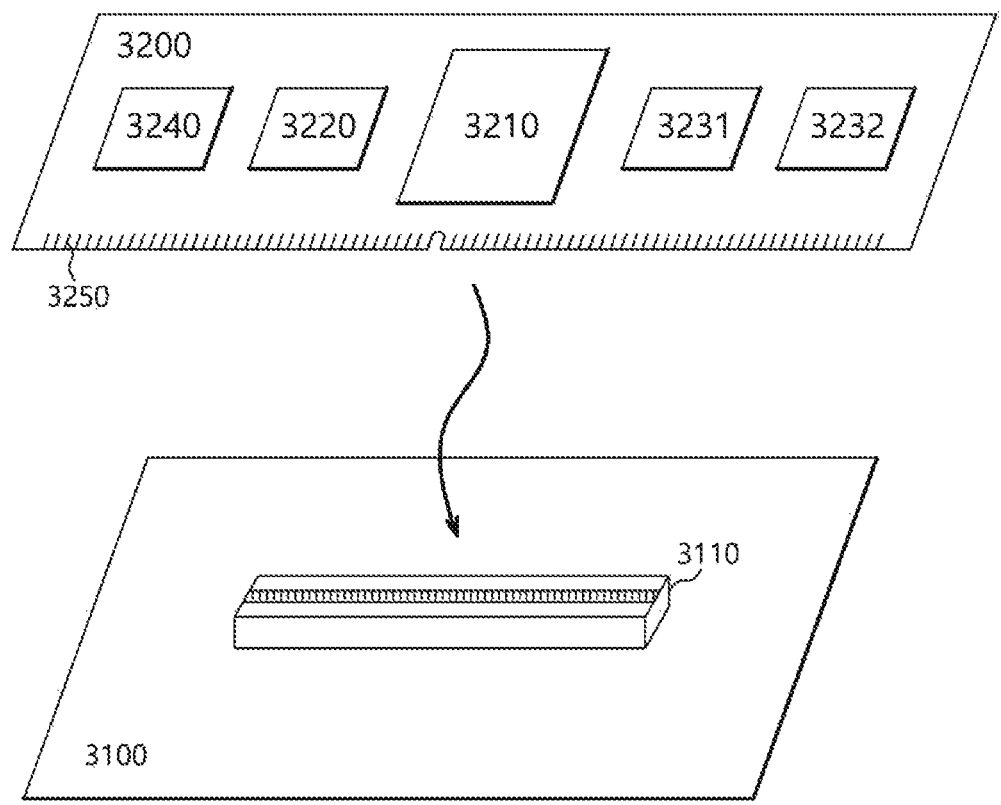
FIG. 7 is a diagram illustrating a data processing system including a data storage apparatus according to an embodiment of the present disclosure.

FIG. 7 is a diagram illustrating a data processing system 3000 including a data storage apparatus 3200 according to an embodiment of the present disclosure. Referring to FIG. 7, the data processing system 3000 may include a host apparatus 3100 and the data storage apparatus 3200.

The host apparatus 3100 may be configured in a board form such as a printed circuit board (PCB). Although not shown in FIG. 7, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 and 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 6.

The buffer memory device 3220 may temporarily store data to be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 8:
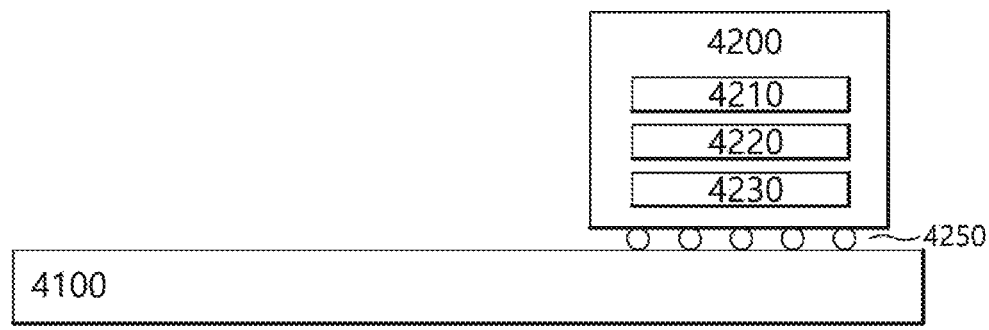
FIG. 8 is a diagram illustrating a data processing system including a data storage apparatus according to an embodiment of the present disclosure.

FIG. 8 is a diagram illustrating a data processing system 4000 including a data storage apparatus 4200 according to an embodiment of the present disclosure. Referring to FIG. 8, the data processing system 4000 may include a host apparatus 4100 and the data storage apparatus 4200.

The host apparatus 4100 may be configured in a board form such as a PCB. Although not shown in FIG. 8, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 6.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 according to control of the controller 4210.

The nonvolatile memory device 4230 may be used as a storage medium of the data storage apparatus 4200.

Figure 9:
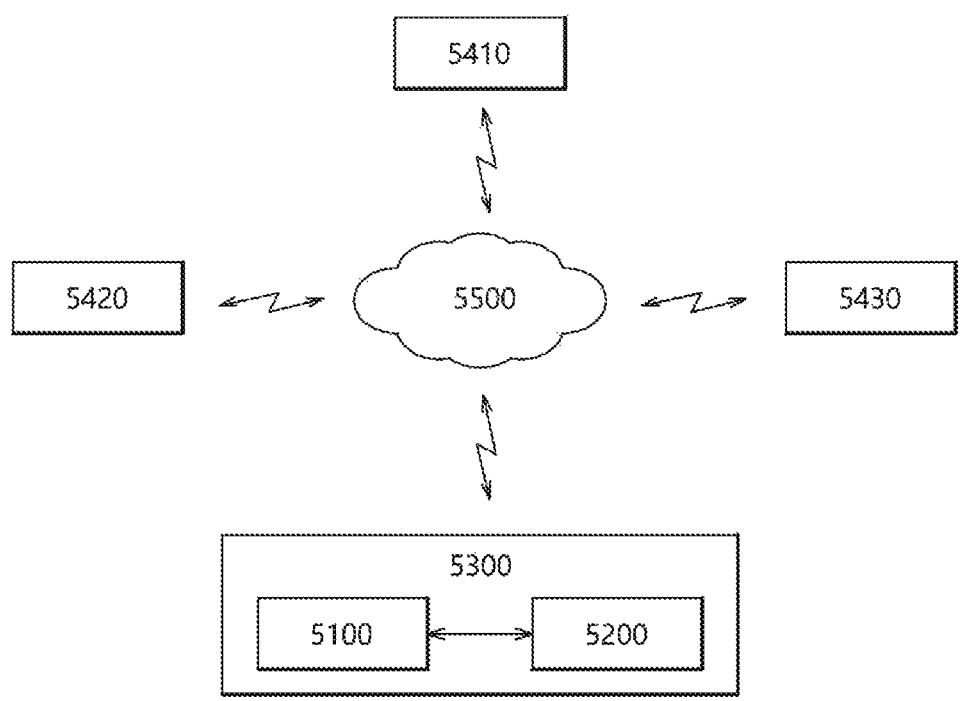
FIG. 9 is a diagram illustrating a network system including a data storage apparatus according to an embodiment of the present disclosure.

FIG. 9 is a diagram illustrating a network system 5000 including a data storage apparatus 5200 according to an embodiment of the present disclosure. Referring to FIG. 9, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and the data storage apparatus 5200. The data storage apparatus 5200 may be configured of the data storage apparatus 10 of FIG. 1, the data storage apparatus 2200 of FIG. 5, the data storage apparatus 3200 of FIG. 7, or the data storage apparatus 4200 of FIG. 8.

Figure 10:
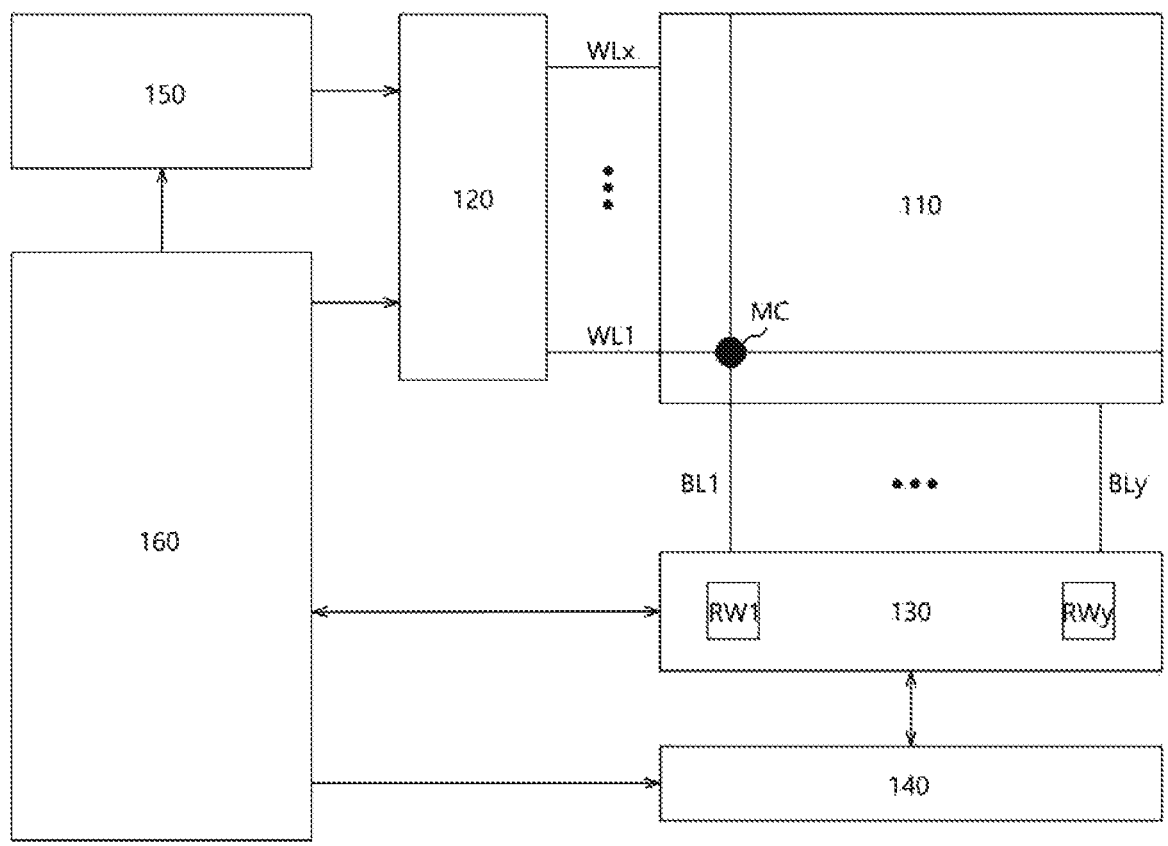
FIG. 10 is a block diagram illustrating a nonvolatile memory device included in a data storage apparatus according to an embodiment of the present disclosure.

FIG. 10 is a block diagram illustrating a nonvolatile memory device 100 included in a data storage apparatus according to an embodiment of the present disclosure. Referring to FIG. 10, the nonvolatile memory device 100 may include a memory cell array 110, a row decoder 120, a column decoder 140, a data read/write block 130, a voltage generator 150, and a control logic 160.

The memory cell array 110 may include memory cells MC arranged in regions in which word lines WL1 to WLx and bit lines BL1 to BLy cross to each other.

The row decoder 120 may be coupled to the memory cell array 110 through the word lines WL1 to WLx. The row decoder 120 may operate according to control of the control logic 160. The row decoder 120 may decode an address provided from an external apparatus (not shown). The row decoder 120 may select and drive the word lines WL1 to WLx based on a decoding result. For example, the row decoder 120 may provide a word line voltage provided from the voltage generator 150 to the word lines WL1 to WLx.

The data read/write block 130 may be coupled to the memory cell array 110 through the bit lines BL1 to BLy. The data read/write block 130 may include read/write circuits RW1 to RWy respectively corresponding to the bit lines BL1 to BLy. The data read/write block 130 may operate according to control of the control logic 160. The data read/write block 130 may operate as a write driver or a sense amplifier according to an operation mode. For example, the data read/write block 130 may operate as the write driver configured to store data provided from an external apparatus in the memory cell array 110 in a write operation. In another example, the data read/write block 130 may operate as the sense amplifier configured to read data from the memory cell array 110 in a read operation.

The column decoder 140 may operate according to control of the control logic 160. The column decoder 140 may decode an address provided from an external apparatus (not shown). The column decoder 140 may couple the read/write circuits RW1 to RWy of the data read/write block 130 respectively corresponding to the bit lines BL1 to BLy and data input/output (I/O) lines (or data I/O buffers) based on a decoding result.

The voltage generator 150 may generate voltages used for an internal operation of the nonvolatile memory device 100. The voltages generated through the voltage generator 150 may be applied to the memory cells of the memory cell array 110. For example, a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation is to be performed.

The control logic 160 may control an overall operation of the nonvolatile memory device 100 based on a control signal provided from an external apparatus. For example, the control logic 160 may control an operation of the nonvolatile memory device 100 such as a read operation, a write operation, an erase operation of the nonvolatile memory device 100.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A data storage apparatus comprising:
a nonvolatile memory device; and
a controller configured to:
  decode normal read data read from a target memory cell of the nonvolatile memory device using one of history read voltages used in a previous successful decoding for a target memory block including the target memory cell,
  calculate a standard deviation of the history read voltages when the decoding of the normal read data fails,
  compare the calculated standard deviation with a preset first threshold value and a preset second threshold value,
  determine a decoding type for the target memory cell based on a comparison result,
  apply the determined decoding type to decode the target memory cell,
  determine a decoding order for the target memory cell based on the comparison result and a result of applying the determined decoding type to decode the target memory cell, and
  re-apply the determined decoding type to decode the target memory cell.

2. The data storage apparatus of claim 1, wherein the controller includes:
a random-access memory configured to store a history read table in which history read voltages for each of a plurality of memory blocks included in the nonvolatile memory device are stored;
an error correction code (ECC) unit including:
  a first hard-decision decoder configured to perform first hard-decision decoding on the target memory cell,
  a second hard-decision decoder configured to perform second hard-decision decoding on the target memory cell,
  a first soft-decision decoder configured to perform first soft-decision decoding on the target memory cell, and
  a second soft-decision decoder configured to perform second soft-decision decoding on the target memory cell; and
a processor configured to control the ECC unit to perform at least one or more among the first hard-decision decoding, the second hard-decision decoding, the first soft-decision decoding, and the second soft-decision decoding on the target memory cell based on the comparison result of the standard deviation with the first threshold value and the second threshold value.

3. The data storage apparatus of claim 2, wherein the processor controls the ECC unit to sequentially perform the first hard-decision decoding and the first soft-decision decoding on the target memory cell when the standard deviation is larger than the first threshold value and smaller than the second threshold value.

4. The data storage apparatus of claim 3, wherein the performing of the first soft-decision decoding is determined according to whether or not the first hard-decision decoding is successful, and
the processor determines whether or not the first soft-decision decoding is successful, and controls the ECC unit to sequentially perform the second hard-decision decoding and the second soft-decision decoding when the first soft-decision decoding fails.

5. The data storage apparatus of claim 2, wherein the processor controls the ECC unit to sequentially perform the first hard-decision decoding and the second hard-decision decoding on the target memory cell when the standard deviation is equal to or smaller than the first threshold value.

6. The data storage apparatus of claim 2, wherein the processor controls the ECC unit to sequentially perform the first soft-decision decoding, the second hard-decision decoding, and the second soft-decision decoding on the target memory cell when the standard deviation is equal to or larger than the second threshold value.

7. The data storage apparatus of claim 6, wherein the processor determines whether or not the first soft-decision decoding is successful and controls the ECC unit to perform the second hard-decision decoding when the first soft-decision decoding fails, and
the processor determines whether or not the second hard-decision decoding is successful and controls the ECC unit to perform the second soft-decision decoding when the second hard-decision decoding fails.

8. An operation method of a data storage apparatus, the method comprising:
decoding normal read data read from a target memory cell of a nonvolatile memory device of the data storage apparatus using one of history read voltages used in a previous successful decoding for a target memory block including the target memory cell;
determining whether or not the decoding of the normal read data read from the target memory cell fails;
calculating a standard deviation of the history read voltages when the decoding of the normal read data fails;
comparing the standard deviation with a preset first threshold value and a preset second threshold value;
determining a decoding type for the target memory cell based on a comparison result;
applying the determined decoding type to decode the target memory cell,
determining a decoding order for the target memory cell based on the comparison result and a result of applying the determined decoding type to decode the target memory cell, and
re-applying the determined decoding type to decode the target memory cell.

9. The method of claim 8, wherein the determining of the decoding type and the decoding order for the target memory cell includes:
performing first hard-decision decoding on the target memory cell when the standard deviation is larger than the first threshold value and smaller than the second threshold value;
determining whether or not the first hard-decision decoding is successful; and
performing first soft-decision decoding on the target memory cell when the first hard-decision decoding fails.

10. The method of claim 9, wherein the determining of the decoding type and the decoding order for the target memory cell further includes: after the performing of the first soft-decision decoding,
determining whether or not the first soft-decision decoding is successful;
performing second hard-decision decoding on the target memory cell when the first soft-decision decoding fails;
determining whether or not the second hard-decision decoding is successful; and
performing second soft-decision decoding on the target memory cell when the second hard-decision decoding fails.

11. The method of claim 8, wherein the determining of the decoding type and the decoding order for the target memory cell includes:
performing first hard-decision decoding on the target memory cell when the standard deviation is equal to or smaller than the first threshold value;
determining whether or not the first hard-decision decoding is successful; and
performing second hard-decision decoding on the target memory cell when the first hard-decision decoding fails.

12. The method of claim 8, wherein the determining of the decoding type and the decoding order for the target memory cell includes:
performing first soft-decision decoding on the target memory cell when the standard deviation is equal to or larger than the second threshold value;
determining whether or not the first soft-decision decoding is successful;
performing second hard-decision decoding on the target memory cell when the first soft-decision decoding fails;
determining whether or not the second hard-decision decoding is successful; and
performing second soft-decision decoding on the target memory cell when the second hard-decision decoding fails.

13. The method of claim 8, wherein the calculating of the standard deviation of the history read voltages includes:
determining whether or not the number of history read voltages for the target memory block is equal to or larger than n; and
calculating the standard deviation of the history read voltages when the number of history read voltages is equal to or larger than n.

14. The method of claim 13, wherein n is a natural number of 2 or more.

15. The method of claim 13, further comprising:
determining whether or not the history read voltage for the target memory block is present before the determining of whether or not the number of history read voltages is equal to or larger than n,
wherein the determining of whether or not the number of history read voltages is equal to or larger than n is performed when the history read voltage for the target memory block is present.

16. The method of claim 15, further comprising:
sequentially performing second hard-decision decoding and second soft-decision decoding when the history read voltage for the target memory block is not present.

17. A data processing apparatus comprising:
a host apparatus; and a data storage apparatus operably coupled to the host apparatus and comprising:

a nonvolatile memory device; and a controller configured to:

decode normal read data read from a target memory cell of the nonvolatile memory device using one of history read voltages used in a previous successful decoding for a target memory block including the target memory cell, calculate a standard deviation of the history read voltages when the decoding of the normal read data fails, compare the calculated standard deviation with a preset first threshold value and a preset second threshold value, determine a decoding type for the target memory cell based on a comparison result, apply the determined decoding type to decode the target memory cell, determine a decoding order for the target memory cell based on the comparison result and a result of applying the determined decoding type to decode the target memory cell, and re-apply the determined decoding type to decode the target memory cell.

18. The data processing system of claim 17, wherein data storage apparatus is configured in a printed circuit board.

19. The data processing system of claim 18, wherein the data storage apparatus is a memory module or a memory card.

20. The data processing system of claim 17, wherein the data storage apparatus is configured in a surface mounting packaging form.

* * * * *